(12) United States Patent
Matsuyama

(10) Patent No.: US 6,937,223 B2
(45) Date of Patent: Aug. 30, 2005

(54) DRIVER HAVING A STORAGE DEVICE, ELECTRO-OPTICAL DEVICE USING THE DRIVER, AND ELECTRONIC APPARATUS

(75) Inventor: Shigeru Matsuyama, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 759 days.

(21) Appl. No.: 09/912,075

(22) Filed: Jul. 24, 2001

(65) Prior Publication Data

US 2002/0059336 A1 May 16, 2002

(30) Foreign Application Priority Data

Jul. 28, 2000 (JP) ........................................ 2000-228409

(51) Int. Cl.[7] ................................................ G09G 3/36
(52) U.S. Cl. ........................................ 345/100; 345/92
(58) Field of Search .............................. 345/87, 98, 99, 345/100, 204, 205, 571–574; 365/189.01–189.05, 230.01–230.06, 210, 230

(56) References Cited

U.S. PATENT DOCUMENTS

| | | | | |
|---|---|---|---|---|
| 5,355,346 | A | * 10/1994 | Shin et al. | 365/230.06 |
| 5,576,737 | A | * 11/1996 | Isozaki | 345/211 |
| 5,822,264 | A | * 10/1998 | Tomishima et al. | 365/222 |
| 6,356,475 | B1 | * 3/2002 | Tamura et al. | 365/145 |
| 6,636,207 | B2 | * 10/2003 | Matsuyama | 345/204 |
| 6,774,892 | B2 | * 8/2004 | Tamura et al. | 345/204 |

* cited by examiner

Primary Examiner—Chanh Nguyen
(74) Attorney, Agent, or Firm—Hogan & Hartson, LLP

(57) ABSTRACT

A display data RAM has a storage area and a pre-charging circuit section. The storage area has LCD bit lines to be used for reading out display data stored in memory cells. The pre-charging circuit section has pre-charging lines and pre-set lines. Pieces of information of a particular order bit among the display data stored in the memory cells can be read out by supplying a potential to a selected one of the pre-charging lines. As a result, the power consumption of the display driver can be reduced.

6 Claims, 4 Drawing Sheets

US 6,937,223 B2

DRIVER HAVING A STORAGE DEVICE, ELECTRO-OPTICAL DEVICE USING THE DRIVER, AND ELECTRONIC APPARATUS

Japanese Patent Application No. 2000-228409, filed Jul. 28, 2000, is hereby incorporated by reference in its entirety.

BACKGROUND OF THE INVENTION

1. Field of the Invention

The present invention relates to a driver having a storage device, an electro-optical device using the driver, and an electronic apparatus.

2. Description of Related Art

Usually, liquid crystal devices employ a method in which a storage device serving as a frame memory is provided in a display driver for driving a liquid crystal display panel and display data are read from the storage device and displayed. For example, at present, passive matrix liquid crystal display panels employ such gray scale display methods as the frame rate control (FRC) gray scale method, the voltage gray scale method, and the pulse width modulation (PWM) method. In the pulse width modulation method, one horizontal scanning period (1H) selected by a common driver for driving common electrodes (scanning electrodes) is divided into periods of a number that is equal to a prescribed number of gray scales and the period in which an on-waveform is applied is varied in accordance with the gray scale. The pulse width modulation method can control liquid crystal application voltages in such a manner that one horizontal scanning period (1H) is divided into periods of the number of bits constituting each unit of display data for gray scale display with weights given to the respective bits. On the other hand, there may occur a case that in applying voltages to the liquid crystal it is necessary to read out information of only a particular order bit such as MSB information or LSB information. At present, this type of driving method is used in the multi-line selection (MLS) driving method, for example, in which a plurality of common electrodes are selected simultaneously.

A description will be made of a case of driving, by the pulse width modulation method, a driver for processing four-gray scale (2-bit) display data. When information of the higher one bit of the two bits is necessary at a certain time point, information of the lower one bit which is unnecessary at that time point is also read out together with the information of the higher one bit.

As a result, useless power is consumed to read out the unnecessary information of the lower one bit; more specifically, it is consumed in a pre-charging operation for rendering the potentials of read lines in a constant, floating state and an operation of reading out memory cell information (current is consumed).

SUMMARY OF THE INVENTION

The present invention has been made in view of the above technical problems in the art, and an objective of the invention is therefore to provide a driver having a storage device capable of reading out pieces of information of a particular order bit of display data that are formed in units of a plurality of order bits, and an electro-optical device using this driver and an electronic apparatus.

According to one aspect of the present invention, there is provided a driver which has a storage device for storing display data and drives a display section based on the display data, wherein the storage device comprises:

a plurality of memory cells;

a plurality of first word lines, one of which is selected to write the display data to part of the memory cells;

a plurality of second word lines paired with the respective first word lines, one of the second word lines being selected to read out the display data in part of the memory cells;

a plurality of first bit lines to be used for writing the display data to part of the memory cells associated with a selected one of the first word lines;

a plurality of second bit lines paired with the respective first bit lines and to be used for reading out the display data in part of the memory cells associated with a selected one of the second word lines;

a pre-charging circuit which pre-charges the second bit lines;

a plurality of first switching elements provided on pre-charging paths between the pre-charging circuit and the second bit lines; and a plurality of first control lines which controls on/off state of the first switching elements according to timing of reading out the display data stored in the respective memory cells.

The driver according to the present invention can be applied to an electro-optical device and electronic apparatus.

DETAILED DESCRIPTION OF EMBODIMENT

Figure 1:
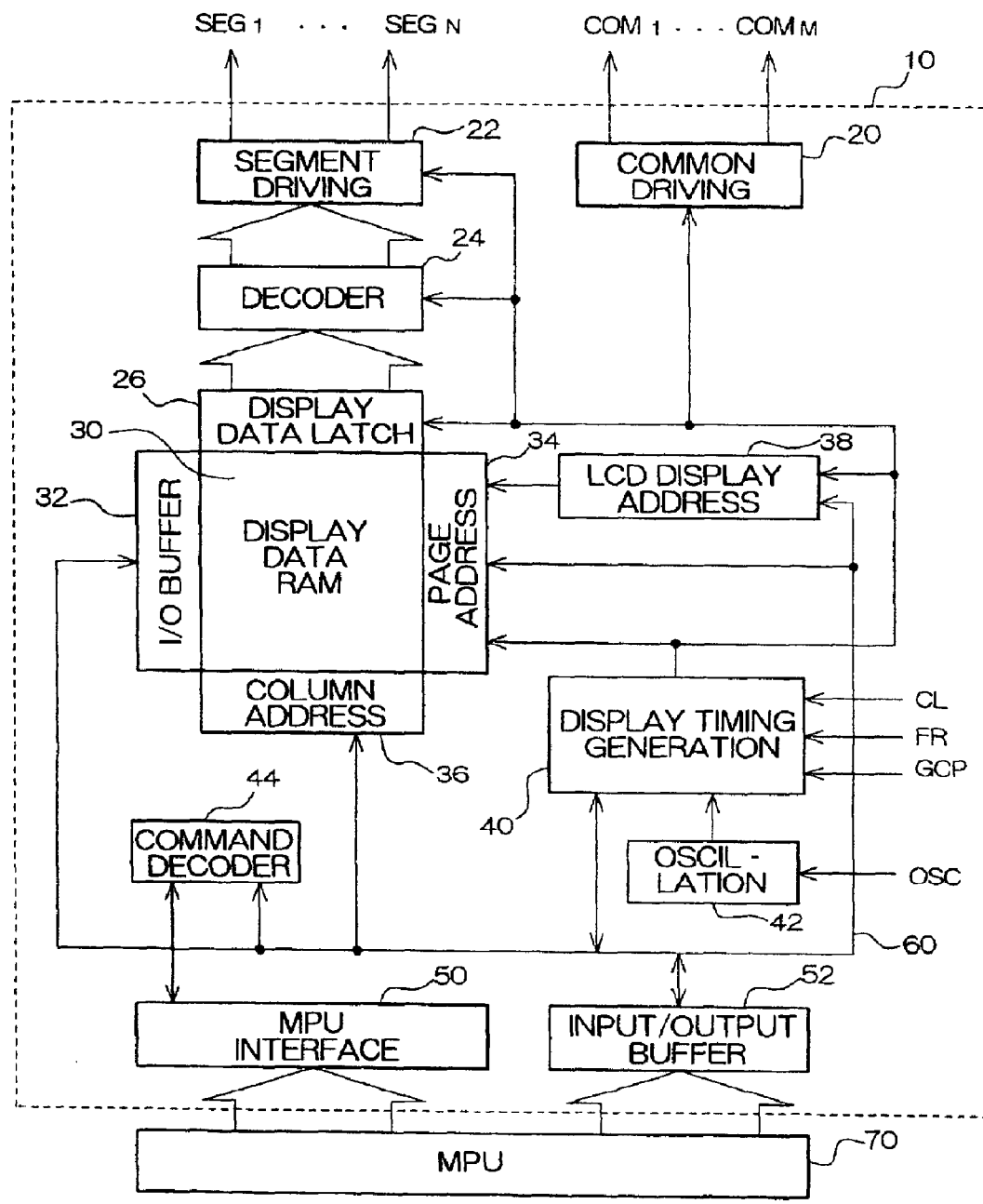
FIG. 1 is a block diagram showing the configuration of a driver according to one embodiment of the present invention.

According to one embodiment of the present invention, there is provided a driver which has a storage device for storing display data and drives a display section based on the display data, wherein the storage device comprises:

a plurality of memory cells;

a plurality of first word lines, one of which is selected to write the display data to part of the memory cells;

a plurality of second word lines paired with the respective first word lines, one of the second word lines being selected to read out the display data in part of the memory cells;

a plurality of first bit lines to be used for writing the display data to part of the memory cells associated with a selected one of the first word lines;

a plurality of second bit lines paired with the respective first bit lines and to be used for reading out the display data in part of the memory cells associated with a selected one of the second word lines;

a pre-charging circuit which pre-charges the second bit lines;

a plurality of first switching elements provided on pre-charging paths between the pre-charging circuit and the second bit lines; and a plurality of first control lines which controls on/off state of the first switching elements according to timing of reading out the display data stored in the respective memory cells.

With this configuration, in reading out display data from the memory cells, particular second bit lines can be pre-charged and pieces of information of only a particular order bit among the display data can be read out. As a result, the power consumption can be reduced.

In this driver, the storage device may further comprise:

a plurality of second switching elements having one ends that are connected to the second bit lines and the other ends that are grounded; and a plurality of second control lines which controls on/off state of the second switching elements according to the same timing as the first switching elements are turned on or off by means of the first control lines.

By providing the second control lines for on/off-controlling the second switching elements according to the same timing as the first control lines are controlled, each of the second bit lines can be pre-charged to a low level each time.

In this driver, the display data may be N-bit information (N is a natural number) and the plurality of first control lines may be N lines; and each of the N first control lines may be used for on/off-controlling part of the first switching elements that are connected to part of the second bit lines, respectively, the part of the second bit lines being used for reading pieces of one-bit information that corresponds to a particular order bit among N-bit information stored in the memory cells.

With this configuration, whether to pre-charge each of the second bit lines to a low level or a high level can be determined selectively.

In this driver, the plurality of second control lines may be N lines that are paired with the respective N first control lines; and each of the N second control lines may be used for on/off-controlling part of the second switching elements that are connected to part of the second bit lines, respectively, the part of the second bit lines being used for reading pieces of one-bit information that corresponds to a particular order bit among N-bit information stored in the memory cells.

With this configuration, the potentials of each of the second bit lines corresponding to display data to be read into a display data latch circuit can be removed. This enables further reduction of the power consumption.

An embodiment of the present invention will be hereinafter described in detail with reference to the accompanying drawings.

Driver

FIG. 1 shows a driver 10 for driving a liquid crystal device capable of 8-gray scale (3-bit) display, for example.

The driver 10 is composed of a common driving circuit 20, a segment driving circuit 22, a decoder 24, a display data latch circuit 26, a display data RAM 30, an I/O buffer circuit 32, a page address circuit 34, a column address circuit 36, an LCD display address circuit 38, a display timing generation circuit 40, an oscillation circuit 42, an MPU interface 50, an input/output buffer 52, etc.

The MPU interface 50 has a plurality of input terminals (not shown) for input of various signals from an external MPU 70. The input terminals are a chip select terminal XCS, a data identification terminal A0, a data bus latch terminal XRD, a data capture terminal XWR, a reset terminal XRES, an input switching terminal P/S, etc.

The chip select terminal XCS is supplied with a signal that determines whether to render the driver 10 in an active state. The data identification terminal A0 is supplied with a signal indicating whether data that is supplied from the MPU 70 is command data or display data. When a signal is supplied to the data bus latch terminal XRD, a data bus 60 is latched and a data signal is output to the data bus 60. When a signal is supplied to the data capture terminal XWR, the data signal on the data bus 60 is captured to the internal section of the driver 10. When a signal is supplied to the reset terminal XRES, setting is made to default values. The input switching terminal P/S is for input switching to one of parallel data and serial data.

The input/output buffer 52 is provided with input/output terminals D0 to D7. Both of command data and display data as processed by the external MPU 70 are supplied to the driver 10 via the input/output terminals D0 to D7.

An exemplary operation performed inside the driver 10 according to various signals supplied to the MPU interface 50 will be described below.

When a signal "0" is input to the data identification terminal A0, input of command data to the input/output buffer 52 is permitted. The command data is supplied to the input/output buffer 52 as serial data with a proper signal supplied to the input switching terminal P/S. The 8-bit serial data is latched by the input/output buffer 52 and then supplied to the command decoder 44 after being converted into parallel data. Similarly, a signal "1" is supplied to the data identification terminal A0 and display data are supplied to the input/output buffer 52. The display data are supplied to the input/output buffer 52 as serial data with a proper signal supplied to the input switching terminal P/S. The 8-bit serial data is latched by the input/output buffer 52 and then sent to the data bus 60 parallel after being converted into parallel data. Command data as decoded by the command decoder 44 is used as an operation command for the display timing generation circuit 40, or is used for address designation of the page address circuit 34 and the column address circuit 36 which are connected to the display data RAM 30 or some other purpose.

The page address circuit 34 performs address control in the page direction in accessing the display data RAM 30 from the external MPU 70. Similarly, the column address circuit 36 performs address control in the column direction in accessing the display data RAM 30 from the external MPU 70.

On the other hand, parallel display data being latched by the data bus 60 are written to memory cells of the display data RAM 30 via the I/O buffer circuit 32 of the display data RAM 30 according to page and column addresses designated by a command.

The display timing generation circuit 40 is supplied with a clock signal CL, a polarity reversing signal FR, a gray scale control signal GCP, etc. The display timing generation circuit 40 changes the timing of those signals using the oscillation circuit 42. The clock signal CL is a signal to be used for controlling frame (one picture) display clocks of the liquid crystal panel. The polarity reversing signal FR is a signal to be used for reversing the polarities of the pixels of the liquid crystal panel every unit period. The gray scale control signal GCP is a signal to be used for controlling the gray scale level.

The display data RAM 30 has memory cells, the number of which is greater than or equal to the product of the number of pixels (one frame) that are formed so as to correspond to respective crossing points of segment electrodes SEG and common electrodes COM of the liquid crystal panel and the number of gray scale bits per pixel. Although in this embodiment an SRAM (static random access memory) is used for forming the memory cells, another storage device such as a DRAM (dynamic random access memory) may be used.

Among the display data stored in the display data RAM 30, pieces of information (one-line information) stored in memory cells of the display data RAM 30 corresponding to one common electrode of the liquid crystal panel are read sequentially into the display data latch circuit 26 under the control of the LCD display address circuit 38. The display data are supplied to the decoder 24 according to the clock signal CL that is supplied from the display timing generation circuit 40. The display data as decoded by the decoder 24 are converted by the segment driving circuit 22 into voltages having levels necessary to drive the liquid crystal panel, which are supplied to the respective segment electrodes SEG. The common electrodes COM that have not been selected yet are selected sequentially by the common driving circuit 20.

Display Data RAM as Comparative Example

In this embodiment, in the above driver 10 that performs display driving using display data that are formed in units of 3 bits (8 gray scales), pieces of information of the same bit of display data are output to the liquid crystal panel at a certain time point.

Figure 4:
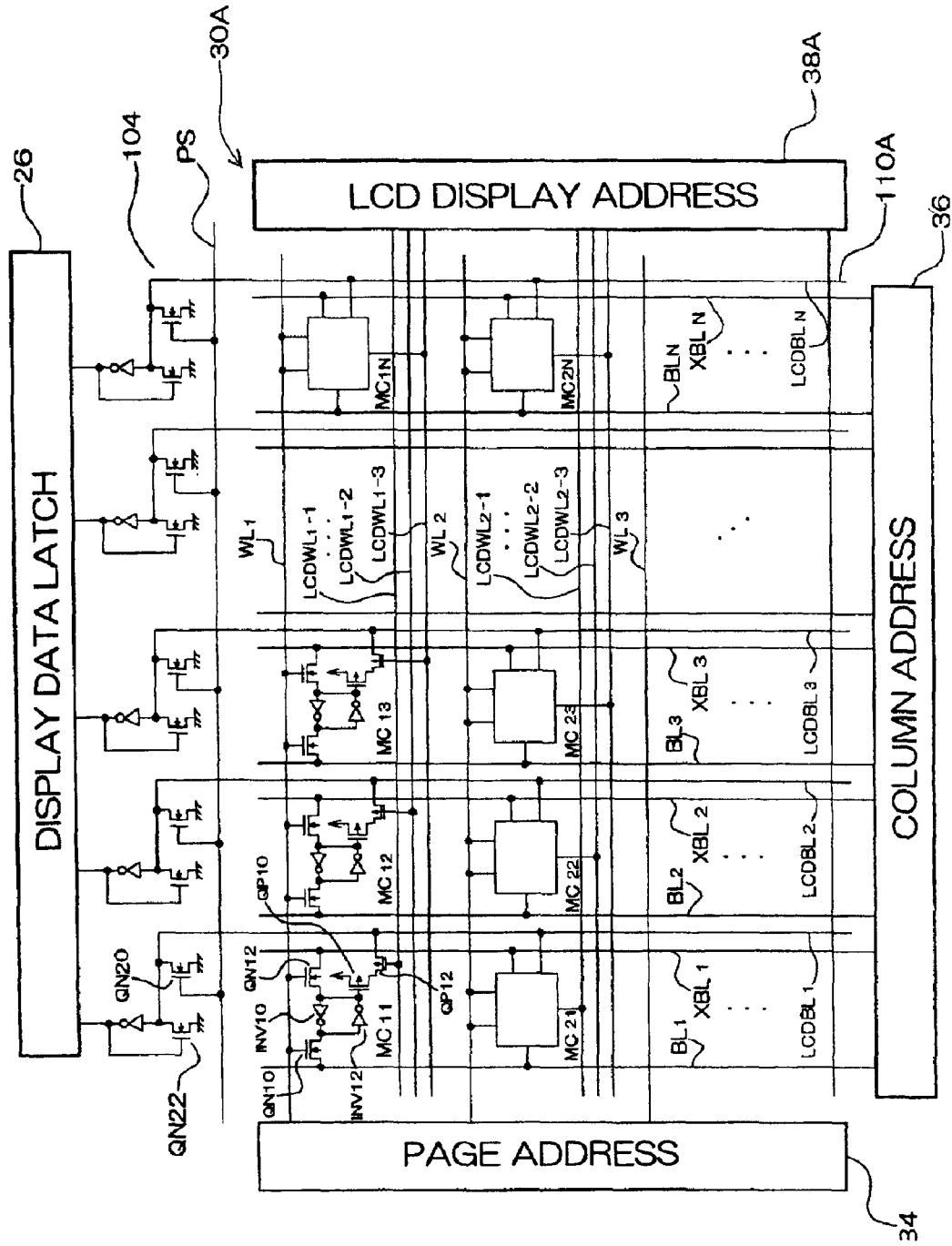
FIG. 4 shows a modification of the display data RAM shown in FIG. 2.

FIG. 4 shows the configuration of an exemplary display data RAM 30A for such display driving.

The display data RAM 30A is composed of a storage area 110A, a pre-charging circuit section 104, etc.

Among the display data stored in the display data RAM 30A, pieces of information (one-line information) stored in memory cells corresponding to one common electrode of the liquid crystal panel are read sequentially into the display data latch circuit 26 under the control of an LCD display address circuit 38A.

M word lines $WL_1$ to $WL_M$, N bit lines $BL_1$ to $BL_N$, and N bit-line pairs $XBL_1$ to $XBL_N$ for performing write control on display data that are supplied from the external MPU 70 are arranged in the storage area 110A. M×N memory cells $MC_{11}$ to $MC_{MN}$ are arranged so as to correspond to respective crossing points of the above lines. N LCD bit lines $LCDBL_1$ to $LCDBL_N$ and M pairs of LCD word lines $LCDWL_1$ to $LCDWL_M$ for supplying the stored pieces of information to the liquid crystal panel or controlling the supply of such pieces of information are arranged so as to correspond to the columns and rows, respectively, of the memory cells $MC_{11}$ to $MC_{MN}$. Each of the M pairs of LCD word lines $LCDWL_1$ to $LCDWL_M$ consists of three LCD word lines. For example, the LCD word line $LCDWL_1$ consists of three LCD word lines $LCDWL_1$-1 to $LCDWL_1$-3.

In the memory cell $MC_{11}$, for example, which is provided in the storage area 110A, n-channel transistors QN10 and QN12, p-channel transistors QP10 and QP12, and inverters INV10 and INV12 are arranged.

In the memory cell $MC_{11}$, when the word line $WL_1$ is selected, the n-channel transistors QN10 and QN12 are turned on and display data is written via the bit line $BL_1$ and the bit-line pair $XBL_1$. The display data is latched by the flip-flop that is formed by the inverters INV10 and INV12. The LCD word line $LCDWL_1$-1 is connected to the gate of the p-channel MOS transistor QP12.

The LCD word line $LCDWL_1$-2 is connected to the gate of the p-channel MOS transistor QP12 of the memory cell $MC_{12}$. The LCD word line $LCDWL_1$-3 is connected to the gate of the p-channel MOS transistor QP12 of the memory cell $MC_{13}$.

The pre-charging circuit section 104 has a preset line PS. The preset line PS issued for on/off-controlling n-channel MOS transistors QN20. When the n-channel MOS transistors QN20 are turned on, a ground potential $V_{SS}$ is supplied to the LCD bit lines $LCDBL_1$ to $LCDBL_N$.

For convenience, with attention paid to the display data of 3 bits stored in the memory cell $MC_{11}$ to $MC_{13}$, a description will be made below of an operation of outputting only the information stored in the memory cell $MC_{11}$ to the liquid crystal panel. To select only the information stored in the memory cell $MC_{11}$, the LCD word line $LCDWL_1$-1 is selected by the LCD display address circuit 38A. Then, the information stored in the memory cell $MC_{11}$ is output to the liquid crystal panel via the LCD bit line $LCDBL_1$.

By forming the display data RAM 30A in the above manner, pieces of information of a prescribed bit among display data can be read out after selecting a proper LCD word line using the LCD display address circuit 38A.

However, the above configuration has a problem that the number of LCD word lines increases in proportion to the number of memory cells of the storage device in the page (row) direction and the number of gray scales of display to be performed on the liquid crystal panel and the size of the display data RAM 30A increases accordingly.

Figure 2:
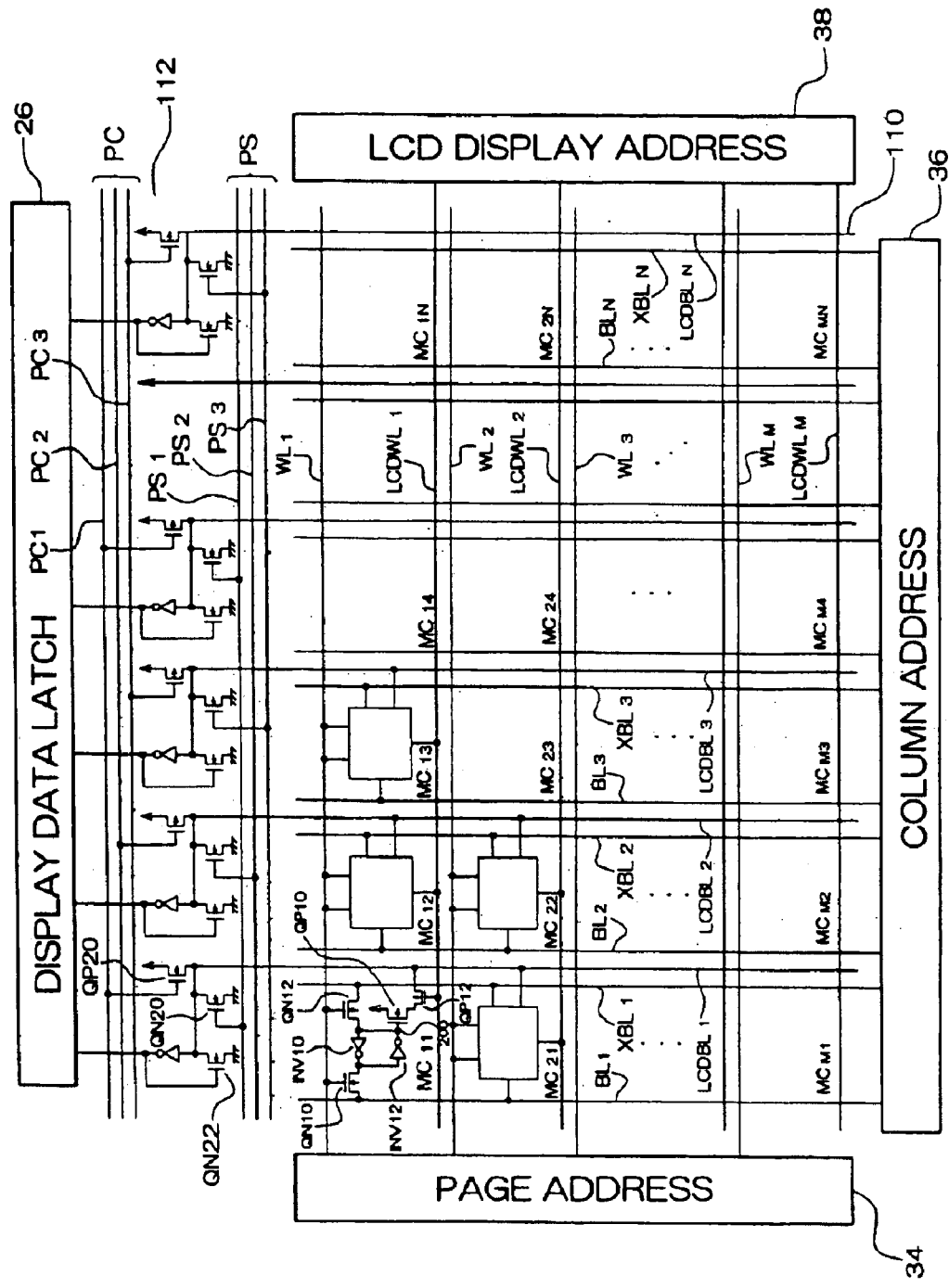
FIG. 2 shows the configuration of a display data RAM shown in FIG. 1.

In view of the above, the display data RAM 30 shown in FIG. 2 is employed, which will be described below.

Display Data RAM According to the Embodiment

FIG. 2 shows the circuit configuration of the display data RAM 30 which is incorporated in the driver 10 according to the embodiment.

The display data RAM 30 has a storage area 110 and a pre-charging circuit section 112.

The pre-charging circuit section 112 is composed of a pre-charging circuit for supplying a potential $V_{DD}$, a pre-charging line PC, and a preset line PS.

The pre-charging line PC is used for on/off-controlling p-channel MOS transistors QP20. When part of the p-channel MOS transistors QP20 are turned on, the power supply potential $V_{DD}$ is supplied to a corresponding part of the LCD bit lines $LCDBL_1$ to $LCDBL_N$.

The preset line PS is used for on/off-controlling n-channel MOS transistors QN20. When part of the n-channel MOS transistors QN20 are turned on, a ground potential $V_{SS}$ is supplied to a corresponding part of the LCD bit lines $LCDBL_1$ to $LCDBL_N$.

In this embodiment, display data that are formed in units of 3 bits are used. Therefore, the pre-charging line PC consists of three pre-charging lines $PC_1$ to $PC_3$ and the preset line PS consists of three preset lines $PS_1$ to $PS_3$.

Inverters INV20 serve to reverse logic outputs that are read out to the LCD bit lines $LCDBL_1$ to $LCDBL_N$, respectively. N-channel MOS transistors QN22 are provided to maintain the amplitude levels of logic outputs that are read out to the LCD bit lines $LCDBL_1$ to $LCDBL_N$, respectively.

Figure 3:
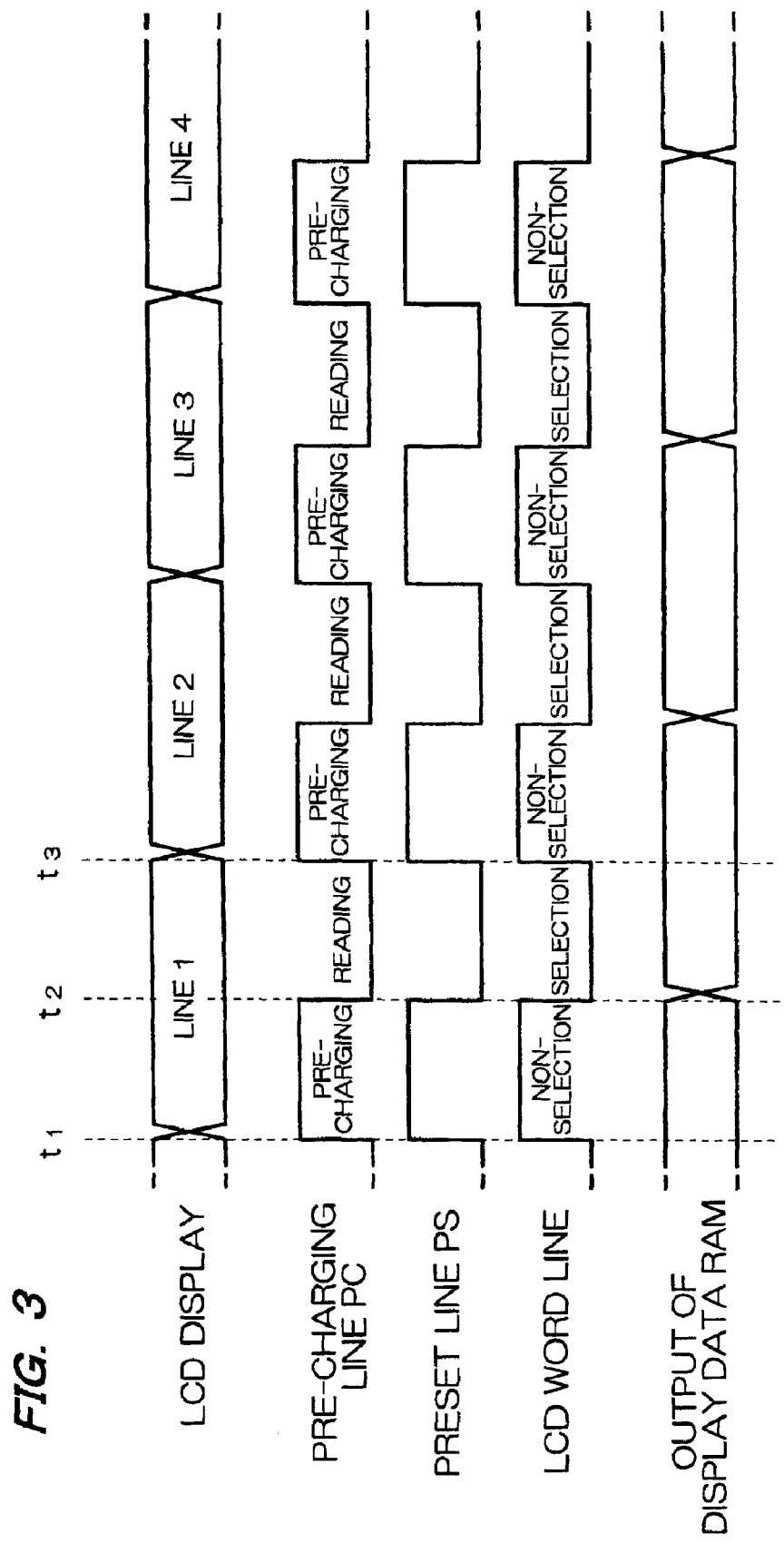
FIG. 3 is a timing chart showing an operation of reading display data from the display data RAM shown in FIG. 2.

FIG. 3 is a timing chart showing an operation of reading the display data stored in the display data RAM 30 for a liquid crystal panel that is driven by the pulse width modulation (PWM) method. Display data are formed in units of 3 bits as described above, and one unit display data is stored in the memory cells $MC_{11}$, $MC_{12}$ and $MC_{13}$, for example. Referring to FIG. 3, a description will be made below of an operation of reading out the MSB data, for example, stored in the memory cell $MC_{11}$ among the display data of 3 bits that are stored in the memory cells $MC_{11}$–$MC_{13}$.

At a time point $t_1$ that is after selection of a subject line (scanning line) of the LCD display section by the LCD display address circuit 38, both of the pre-charging line $PC_1$ and the preset line $PS_1$ are selected. At the time point $t_1$, a high-level potential "H" is supplied to each of the pre-charging line $PC_1$ and the preset line $PS_1$. The n-channel MOS transistors QN20 is turned on and the p-channel MOS transistors QP20 is turned off, whereby the LCD bit line $LCDBL_1$ is pre-charged to a low level "L." At this time, a high-level potential "H" is supplied to each of the LCD bit lines $LCDBL_2$ and $LCDBL_3$ and hence they are not pre-charged to a low level "L."

At a time point $t_2$, the pre-charging line $PC_1$ is supplied with a low-level potential "L" and the pre-charging is finished. Then, the LCD word line $LCDWL_1$ is selected, whereby the information of the memory cell $MC_{11}$ is read from the display data RAM 30 to the outside via the LCD word line $LCDWL_1$. At this time, since the preset lines $PS_2$ and $PS_3$ are at a low level "L," the p-channel MOS transistors QP20 are on and both of the LCD bit lines $LCDBL_2$ and $LCDBL_3$ are charged to a high level "H" that is the power supply potential level $V_{DD}$. Therefore, the pieces of information of the memory cells $MC_{12}$ and $MC_{13}$ are not read to the LCD bit lines $LCDBL_2$ and $LCDBL_3$. That is, with the above-described operation, the MSB information stored in the memory cell $MC_{11}$ is read to the outside of the display data RAM 30.

The read-out data is supplied to the liquid crystal panel via the segment driving circuit 22 from the time point $t_2$ to a time point $t_3$.

The pieces of information of memory cells selected by the LCD display address circuit 38 are read out by the same operation.

By causing the display data RAM 30 to operate in the above-described manner, intermediate bit information, the LSB information, or the like of the display data can be read out selectively.

As described above, the embodiment provides the following advantages.

Among the display data stored in the storage device that is incorporated in the display driver, pre-charging can be performed for data of only a particular order bit and the data can be read out and supplied to the liquid crystal panel while pre-charging is not performed for data of an unnecessary bit and the data are not read out. This enables reduction of the power consumption.

Further, a display data RAM can be formed without increasing the number of LCD word lines, which can prevent increase of the size of the storage device itself.

The invention is not limited to the above embodiment, and various modifications are possible without departing from the spirit and scope of the invention. For example, although in the embodiment display data formed in units of 3 bits are used, it is naturally possible to apply the invention to a display driver for 256-gray scale (8-bit) display. In this case, eight pre-charging lines $PC_1$ to $PC_8$ and eight preset lines $PS_1$ to $PS_8$ (eight pairs of lines) are necessary.

Although the embodiment is directed to the TFT liquid crystal device, the invention can also be applied to other types of display devices.

The invention can be applied to drivers that require a storage device on which reading is performed by using a separate system such as the LCD bit lines of the embodiment.

The invention can be applied to various electronic apparatuses such as cell phones, game machines, electronic notes, personal computers, word processors, TV receivers, and car navigation apparatuses.

What is claimed is:

1. A driver which has a storage device for storing display data and drives a display section based on the display data, wherein the storage device comprises:

a plurality of memory cells;

a plurality of first word lines, one of which is selected to write the display data to part of the memory cells;

a plurality of second word lines paired with the respective first word lines, one of the second word lines being selected to readout the display data in part of the memory cells;

a plurality of first bit lines to be used for writing the display data to part of the memory cells associated with a selected one of the first word lines;

a plurality of second bit lines paired with the respective first bit lines and to be used for reading out the display data in part of the memory cells associated with a selected one of the second word lines;

a pre-charging circuit which pre-charges the second bit lines;

a plurality of first switching elements provided on pre-charging paths between the pre-charging circuit and the second bit lines; and a plurality of first control lines which controls on/off state of the first switching elements according to timing of reading out the display data stored in the respective memory cells.

2. The driver as defined in claim 1, wherein the storage device further comprises:

a plurality of second switching elements having one ends that are connected to the second bit lines and the other ends that are grounded; and a plurality of second control lines which controls on/off state of the second switching elements according to the same timing as the first switching elements are turned on or off by means of the first control lines.

3. The driver as defined in claim 2, wherein the display data is N-bit information (N is a natural number) and the plurality of first control lines are N lines; and wherein each of the N first control lines is used for on/off-controlling part of the first switching elements that are connected to part of the second bit lines, respectively, the part of the second bit lines being used for reading pieces of one-bit information that corresponds to a particular order bit among N-bit information stored in the memory cells.

4. The driver as defined in claim 3, wherein the plurality of second control lines are N lines that are paired with the respective N first control lines; and wherein each of the N second control lines is used for on/off-controlling part of the second switching elements that are connected to part of the second bit lines, respectively, the part of the second bit lines being used for reading pieces of one-bit information that corresponds to a particular order bit among N-bit information stored in the memory cells.

5. An electro-optical device comprising the driver as defined in claim 1.

6. An electronic apparatus comprising the electro-optical device as defined in claim 5.

* * * * *